US012692620B2

(12) United States Patent
Lin et al.

(10) Patent No.: US 12,692,620 B2
(45) Date of Patent: Jul. 28, 2026

(54) APPARATUS FOR PRODUCING SILICON CARBIDE CRYSTAL

(71) Applicant: HERMES-EPITEK CORP., Taipei City (TW)

(72) Inventors: Chih-Lung Lin, Taipei City (TW); Po-Fei Yang, Taipei City (TW); Chie-Sheng Liu, Taipei City (TW); Chung-Hao Lin, Taipei City (TW); Hsin-Chen Yeh, Taipei City (TW); Hao-Wen Wu, Taipei City (TW)

(73) Assignee: HERMES-EPITEK CORP., Taipei City (TW)

( * ) Notice: Subject to any disclaimer, the term of this patent is extended or adjusted under 35 U.S.C. 154(b) by 448 days.

(21) Appl. No.: 18/454,566

(22) Filed: Aug. 23, 2023

(65) Prior Publication Data

US 2024/0068124 A1 Feb. 29, 2024

(30) Foreign Application Priority Data

Aug. 24, 2022 (TW) .................................. 111131823

(51) Int. Cl.
*C30B 23/02* (2006.01)
*C30B 29/36* (2006.01)

(52) U.S. Cl.
CPC ............ *C30B 23/025* (2013.01); *C30B 29/36* (2013.01)

(58) Field of Classification Search
CPC ........ C30B 23/025; C30B 23/02; C30B 29/36
See application file for complete search history.

(56) References Cited

FOREIGN PATENT DOCUMENTS

CN        106757321 A   *   5/2017   ............. C30B 23/00
JP        2013136494 A   *   7/2013
JP        2020132438 A   *   8/2020

* cited by examiner

*Primary Examiner* — Robert M Kunemund
(74) *Attorney, Agent, or Firm* — Muncy, Geissler, Olds & Lowe, P.C.

(57)               ABSTRACT

An apparatus for producing silicon carbide crystal is provided and includes a composite structure formed by a plurality of graphite layers and silicon carbide seed crystals, wherein a density or thickness of each layer of graphite is gradually adjusted to reduce a difference of a thermal expansion coefficient and Young's modulus between the graphite layers and silicon carbide. The composite structure can be stabilized on a top portion or an upper cover of a crucible made of graphite, thereby preventing the silicon carbide crystal from falling off.

9 Claims, 3 Drawing Sheets

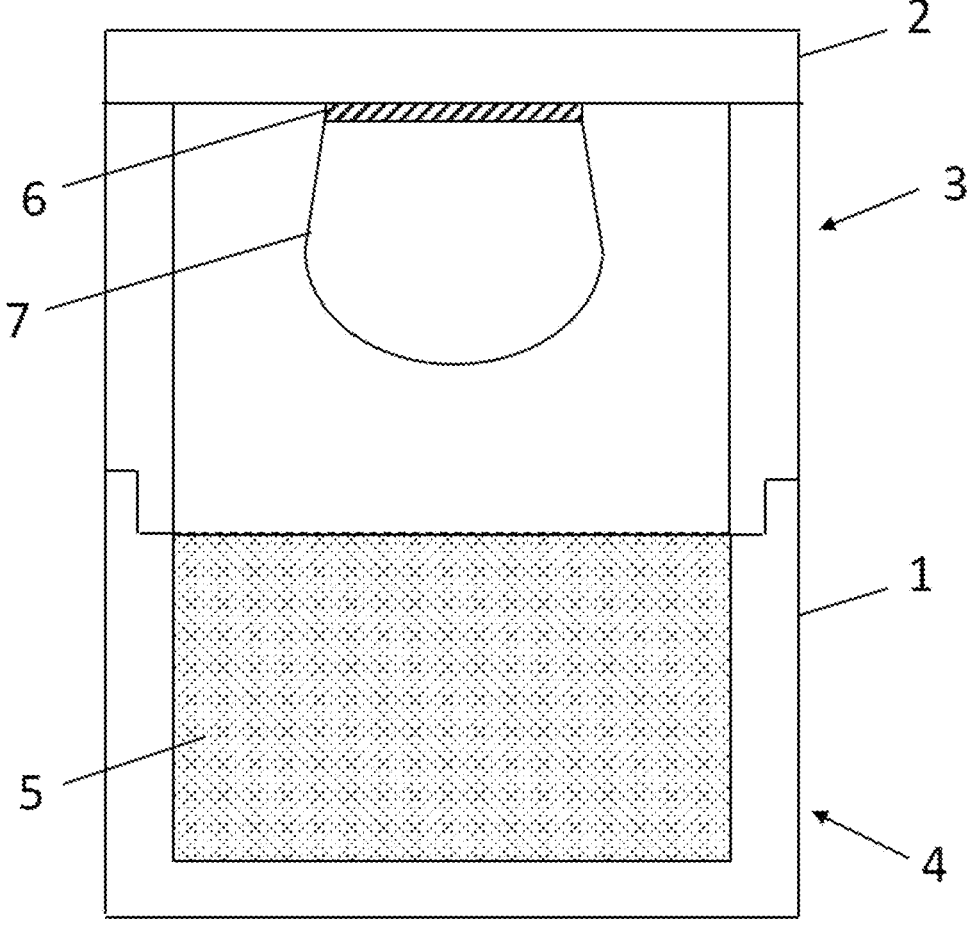
FIG. 1 *(Prior art)*

APPARATUS FOR PRODUCING SILICON CARBIDE CRYSTAL

BACKGROUND OF THE INVENTION

1. Field of the Invention

The present disclosure relates to an apparatus for producing silicon carbide crystal, particularly an apparatus for producing silicon carbide crystal having a composite seed crystal.

2. Description of the Prior Art

As shown in FIG. 1, the silicon carbide crystal 7 is usually prepared by physical vapor transport (PVT). Silicon carbide seed crystal 6 is placed on a top portion 3 or an upper cover 2 of a crucible 1 that is made of graphite. Silicon carbide powder 5 used for crystal growth is placed in a bottom portion 4 of the crucible 1. After the crucible 1 is heated, vapor of the silicon carbide powder 5 condenses on the silicon carbide seed crystal 6 due to a temperature gradient and becomes a single crystal silicon carbide crystal 7 over time.

A thermal expansion coefficient of a substance differs greatly between room temperature and high temperature. According to literature, when the temperature rises from room temperature to 1,000° C., a thermal expansion coefficient of silicon carbide (4H—SiC) having a hexagonal crystal structure increases from $3.2 \ E^{-6}/K$ to $5 \ E^{-6}/K$ (Z Li, et. al.; Thermal expansion of the hexagonal (4H) polytype of SiC; Journal of Applied Physics 60, 612 (1986)). A thermal expansion coefficient of graphite material is about 20-200° C., it is about $2.7 \ E^{-6}/K$ to $4.7 \ E^{-6}/K$, as shown in Table 1.

TABLE 1

|  | Temperature | Coefficient of thermal expansion | Young's modulus |
|---|---|---|---|
| Graphite | 20-200° C. | $2.7E^{-6}/K$-$4.7E^{-6}/K$ | 8-13 GPa |
| Silicon carbide (4H-SiC) | 25-1,000° C. | $3.2E^{-6}/K$-$5.0E^{-6}/K$ | 430-480 GPa |

At high temperatures, due to the difference in the thermal expansion coefficient of graphite and silicon carbide seed crystals and the difference in Young's modulus, especially the Young's modulus of graphite is relatively small (J B Spicer, et. al.; Effects of graphite porosity and anisotropy on measurements of elastic modulus using laser ultrasonics; 2014 IEEE International Ultrasonics Symposium, 2014, pp. 232-235; H Kitahara, et. al.; Mechanical Behavior of Single Crystalline and Polycrystalline Silicon Carbides Evaluated by Vickers Indentation; Journal of the Ceramic Society of Japan 109, 602 (2001)), the formed stress prone to cause graphite to warp or crack and, in consequence, the crystals are fall off during the reaction.

SUMMARY OF THE INVENTION

In order to solve the above problems, the present disclosure provides an apparatus for producing silicon carbide crystal including a composite structure formed by multiple graphite layers and silicon carbide seeds. A density or a thickness of each of graphite layer is gradually adjusted to reduce the difference between the thermal expansion coefficient and Young's modulus between graphite and silicon carbide. Under the high-temperature PVT process of 2,000~2,500° C., the composite structure can be firmly fixed on the top portion or upper cover of the crucible made of graphite, thereby preventing the crystal from falling off.

The present disclosure provides an apparatus for producing silicon carbide crystal, including:

a crucible comprising a top portion and a bottom portion, wherein the bottom portion including silicon carbide powder;

an upper cover positioned on the top portion and defining a reaction space with the crucible; and a composite structure including a plurality of graphite layers and a silicon carbide seed crystal, wherein the silicon carbide seed crystal is positioned inside the upper cover through the graphite layers.

BRIEF DESCRIPTION OF THE DRAWINGS

FIG. 1 is a schematic diagram of a general apparatus for producing silicon carbide crystal;

DESCRIPTION OF THE PREFERRED EMBODIMENTS

Figures 2A, 2B:
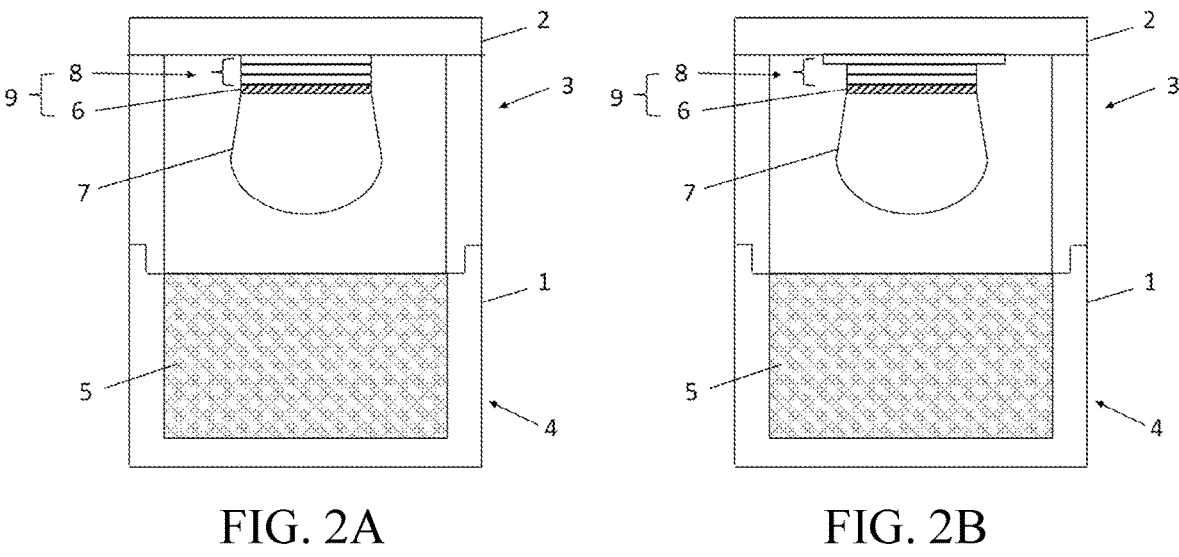
FIGS. 2A and 2B are schematic diagrams of apparatus for producing silicon carbide crystals according to embodiment 1-1 and embodiment 1-2 of the present disclosure.

The present invention will be described in detail with embodiments and attached drawings below for a better understanding. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. The definition of the patent scope shall be based on the scope of the claims. It should be noted that the drawings are only to depict the present invention schematically but not to show the real dimensions or quantities of the present invention. Besides, matterless details are not necessarily depicted in the drawings to achieve conciseness of the drawings.

Please refer to FIG. 2A and FIG. 2B, which are schematic diagrams illustrating the apparatus for producing silicon carbide crystal of Embodiment 1-1 and Embodiment 1-2 of the present disclosure, respectively. The apparatus for producing silicon carbide crystal includes a crucible 1 having a top portion 3 and a bottom portion 4; an upper cover 2 positioned on the top portion 3; and a composite structure 9 including a plurality of graphite layers 8 and a silicon carbide seed crystal 6. The upper cover 2 and the crucible 1 form a reaction space. The bottom portion 4 of the crucible 1 contains silicon carbide powder 5. The silicon carbide seed crystal 6 is positioned inside the upper cover 2 through the graphite layers 8, so that the silicon carbide seed crystal 6 and the upper cover 2 are located on opposite surfaces of the graphite layers 8. The difference between embodiment 1-2 and embodiment 1-1 is that among the graphite layers 8, an area of the uppermost graphite layer contacting the upper cover 2 is greater than other graphite layers, preferably the areas of the graphite layers 8 gradually decrease in a direction from the upper cover 2 to the silicon carbide seed crystal 6, thereby reducing a contact area between the silicon carbide seed crystal 6 and the graphite layers 8. The crucible 1 and the upper cover 2 are made of graphite.

Figures 3A, 3B:
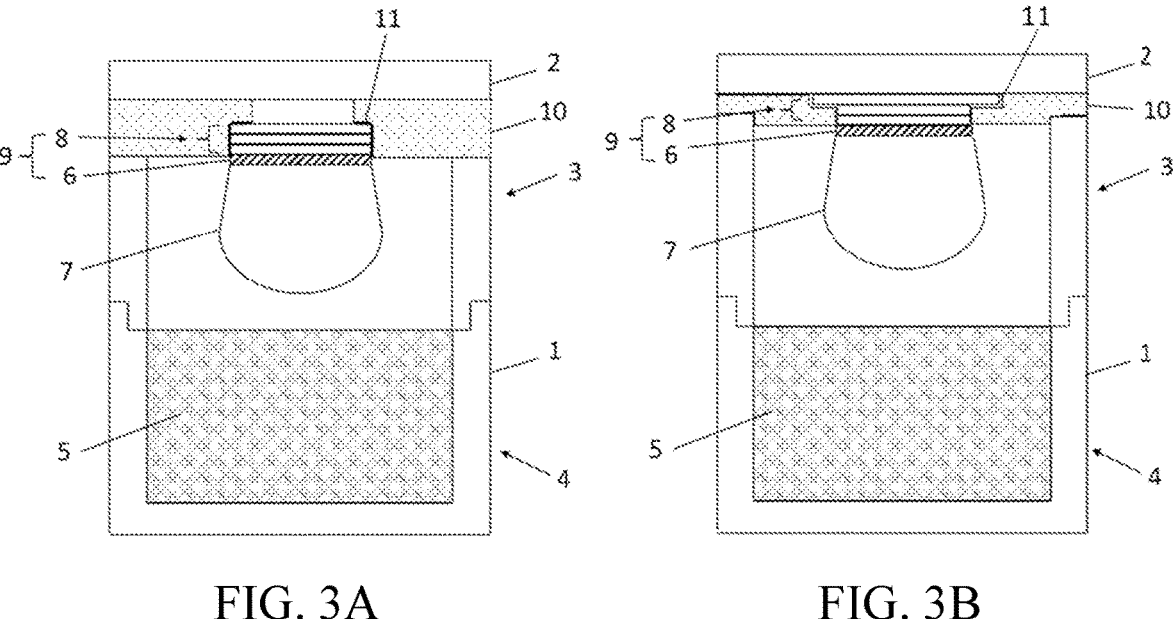
FIGS. 3A and 3B are schematic diagrams of apparatus for producing silicon carbide crystals according to embodiment 2-1 and embodiment 2-2 of the present disclosure.

Next, please refer to FIG. 3A and FIG. 3B which are schematic diagrams illustrating the apparatus for producing silicon carbide crystal of embodiment 2-1 and embodiment 2-2 of the present disclosure, respectively. The difference between the device structure of these two embodiments and the previous embodiments is that it further includes a supporting member 10 which is positioned on the top portion 3 of the crucible 1 and is positioned inside the upper cover 2 for fixing the composite structure 9. In embodiment 2-1, edges of the graphite layers 8 is attached to the supporting member 10 through an adhesive 11 containing having a carbon content of 1-40 wt %. In embodiment 2-2, the area of the uppermost graphite layer contacting the upper cover 2 is greater than areas of the other graphite layers, so the protruding portion can be placed directly on the supporting member 10.

Figures 4A, 4B:
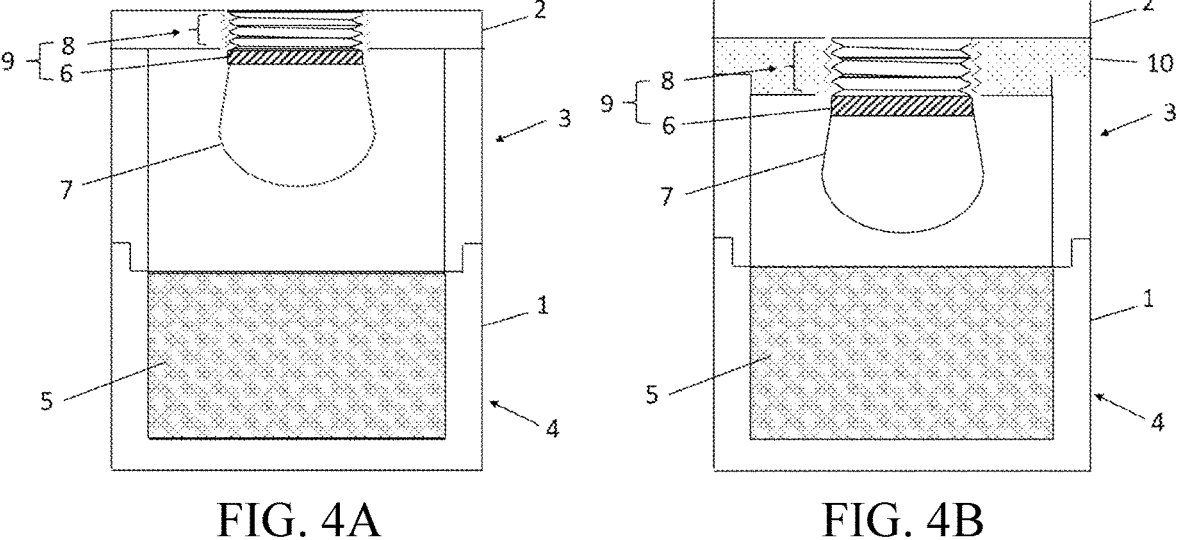
FIGS. 4A and 4B are schematic diagrams of apparatus for producing silicon carbide crystals according to embodiment 3-1 and embodiment 3-2 of the present disclosure.

Finally, please refer to FIG. 4A and FIG. 4B which are schematic diagrams illustrating the apparatus for producing silicon carbide crystal of embodiment 3-1 and embodiment 3-2 of the present disclosure, respectively. Embodiment 3-1 has the same elements as embodiment 1-1 and the differences are that the edges of the graphite layers 8 of embodiment 3-1 have a threaded structure, and the upper cover 2 has a corresponding threaded structure, so that the graphite layers 8 are fixedly locked on the upper cover 2 through the thread structures. Embodiment 3-2 has the same elements as embodiment 2-1 and the differences are that the edges of the graphite layers 8 of embodiment 3-2 have a thread structure, and the supporting element 10 has a corresponding thread structure, so that the graphite layers 8 are fixedly locked on the supporting member 10 through the thread structures.

In the above embodiment, a total thickness of the graphite layers 8 is 0.5-30 mm, a density of each graphite layer is between 1.7-1.9 g/cm$^3$, and a thermal expansion coefficient is between 4.0-5.2 E$^{-6}$/K. In some embodiments, the thermal expansion coefficient of the graphite layer contacting the silicon carbide seed crystal 6 is greater than the thermal expansion coefficient of the other graphite layers. The thermal expansion coefficient of the graphite layer contacting the silicon carbide seed crystal 6 is approximate to a thermal expansion coefficient of the silicon carbide seed crystal 6. Preferably, the thermal expansion coefficient of the graphite layers gradually increases in a direction from the upper cover 2 to the silicon carbide seed crystal 6.

In some embodiments, the graphite layers 8 are bonded with each other by an adhesive 11 having a carbon content of 1-40 wt %. The graphite layers 8 and the silicon carbide seed crystal 6 and the upper cover 2 are bonded with each other by the adhesive having the carbon content of 1-40 wt %. Preferably, the carbon content of the adhesive 11 gradually increases in a direction from the upper cover 2 to the silicon carbide seed crystal 6, thereby increasing viscosity, and the adhesive 11 can also serve as a stress buffering matrix.

Exemplary examples of the adhesive 11 include resin or any adhesive having a carbon content of 1-40 wt % in the prior art.

The carbon content of the adhesive 11 means that an amount of the carbon of the adhesive 11 is 1-40 wt %. For example, 40 g carbon is added in 60 g resin solution to form the adhesive 11.

What is claimed is:

1. An apparatus for producing silicon carbide crystal, comprising:
   a crucible comprising a top portion and a bottom portion, wherein the bottom portion comprising silicon carbide powder;
   an upper cover positioned on the top portion and defining a reaction space with the crucible; and
   a composite structure comprising a plurality of graphite layers and a silicon carbide seed crystal, wherein the silicon carbide seed crystal is positioned inside the upper cover through the graphite layers, edges of the graphite layers comprise a thread structure, and the thread structure is fixed to the upper cover.

2. The apparatus for producing silicon carbide crystal of claim 1, wherein the graphite layers, the silicon carbide seed crystal, and the upper cover are bonded with each other by an adhesive having a carbon content of 1-40 wt %.

3. The apparatus for producing silicon carbide crystal of claim 2, wherein the carbon content of the adhesive gradually increases in a direction from the upper cover to the silicon carbide seed crystal.

4. The apparatus for producing silicon carbide crystal of claim 1 further comprises a supporting member disposed on the top portion and inside the upper cover, thereby fixing the composite structure.

5. The apparatus for producing silicon carbide crystal of claim 4, wherein edges of the graphite layers are bonded to the supporting member by an adhesive having a carbon content of 1-40 wt %.

6. The apparatus for producing silicon carbide crystal of claim 4, wherein edges of the graphite layers comprise a thread structure, wherein the thread structure is fixed to the supporting member.

7. The apparatus for producing silicon carbide crystal of claim 1, wherein among the graphite layers, an area of the graphite layer contacting the upper cover is greater than that of the other graphite layers.

8. The apparatus for producing silicon carbide crystal of claim 1, wherein among the graphite layers, a thermal expansion coefficient of the graphite layer contacting the silicon carbide seed crystal is greater than that of the other graphite layers and is approximate to a thermal expansion coefficient of the silicon carbide seed crystal.

9. The apparatus for producing silicon carbide crystal of claim 1, wherein the crucible is made of graphite.

* * * * *